US011308453B2

(12) United States Patent
Cui (10) Patent No.: US 11,308,453 B2
(45) Date of Patent: Apr. 19, 2022

(54) METHOD AND SYSTEM FOR SCHEDULING PIECES OF MATERIALS BASED ON REAL-TIME DEVICE STATUS

(71) Applicant: BEIJING NAURA MICROELECTRONICS EQUIPMENT CO., LTD, Beijing (CN)

(72) Inventor: Lin Cui, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 979 days.

(21) Appl. No.: 16/009,573

(22) Filed: Jun. 15, 2018

(65) Prior Publication Data

US 2018/0300691 A1 Oct. 18, 2018

Related U.S. Application Data

(63) Continuation of application No. PCT/CN2015/099867, filed on Dec. 30, 2015.

(30) Foreign Application Priority Data

Dec. 17, 2015 (CN) .......................... 201510953336.4

(51) Int. Cl.
*G06Q 10/10* (2012.01)
*B62D 61/06* (2006.01)
(Continued)

(52) U.S. Cl.
CPC ......... *G06Q 10/1093* (2013.01); *B62D 61/06* (2013.01); *G05B 19/418* (2013.01);
(Continued)

(58) Field of Classification Search
CPC .............. G06Q 10/1093; G05B 19/418; G05B 2219/45031; B62D 61/06; H01L 21/677; H01L 21/67
See application file for complete search history.

(56) References Cited

U.S. PATENT DOCUMENTS 7,664,561 B1 * 2/2010 Chen ................. G05B 19/41865
700/101
10,101,721 B2 * 10/2018 Wu ................... G05B 19/41865
(Continued)

FOREIGN PATENT DOCUMENTS

| CN | 1505836 A | 6/2004 |
| CN | 101179043 A | 5/2008 |

(Continued)

OTHER PUBLICATIONS

The World Intellectual Property Organization (WIPO) International Search Report for PCT/CN2015/099867 dated Sep. 20, 2016 6 Pages (including translation).

*Primary Examiner* — Seahvosh Nikmanesh
(74) *Attorney, Agent, or Firm* — Anova Law Group, PLLC (57) ABSTRACT

The present disclosure provides a method and system for scheduling pieces of materials based on a real-time status of a device. Scheduling rules for scheduling the pieces of materials are obtained according to determined parameters. It is determined whether all designated transmission and process tasks of the pieces of materials are completed. If the designated transmission and processing tasks of the pieces of materials are completed, terminating the scheduling of the pieces of materials. If the designated transmission and processing tasks of the pieces of materials are not completed, each of the scheduling rules for scheduling the pieces of materials according to real-time status information of the device are traversed, and according to a traversing result, (Continued)

operation instructions corresponding to the scheduling rules for scheduling the pieces of materials are executed. The real-time status information of the device is updated according to a device status after executions of the operation instructions are completed.

11 Claims, 6 Drawing Sheets

(51) Int. Cl.
*G05B 19/418* (2006.01)
*H01L 21/677* (2006.01)
*H01L 21/67* (2006.01)
*H01L 21/687* (2006.01)

(52) U.S. Cl.
CPC .. *H01L 21/677* (2013.01); *G05B 2219/45031* (2013.01); *H01L 21/67207* (2013.01); *H01L 21/68707* (2013.01)

(56) References Cited

U.S. PATENT DOCUMENTS

| | | | |
|---|---|---|---|
| 2004/0234362 | A1 | 11/2004 | Iijima et al. |
| 2007/0073430 | A1* | 3/2007 | Govind ............ G05B 19/41865 700/99 |
| 2008/0091301 | A1 | 4/2008 | Brantmark et al. |
| 2010/0023151 | A1* | 1/2010 | Shieh ............... G05B 19/41885 700/105 |
| 2013/0190913 | A1* | 7/2013 | Lamparter ........... G05B 19/418 700/99 |
| 2014/0236515 | A1* | 8/2014 | Ho ........................ G06Q 10/04 702/84 |

FOREIGN PATENT DOCUMENTS

| | | |
|---|---|---|
| CN | 101226870 A | 7/2008 |
| CN | 101459098 A | 6/2009 |
| CN | 102831494 A | 12/2012 |
| CN | 103116813 A | 5/2013 |
| JP | 2003197711 A | 7/2003 |
| TW | 409925 U | 10/2000 |

\* cited by examiner

METHOD AND SYSTEM FOR SCHEDULING PIECES OF MATERIALS BASED ON REAL-TIME DEVICE STATUS

CROSS-REFERENCE TO RELATED APPLICATIONS

This application is a continuation application of International Application No. PCT/CN2015/099867, filed on Dec. 30, 2015, which claims priority to Chinese Patent Application No. 201510953336.4, filed on Dec. 17, 2015. The above enumerated patent applications are incorporated herein by reference.

TECHNICAL FIELD

The present disclosure pertains to the field of microelectronics and relates to semiconductor fabrication devices, and more particularly, to a method and a system for scheduling pieces of materials based on a real-time status of a semiconductor device.

BACKGROUND

With the development of semiconductor technology, semiconductor fabrication devices are more and more sophisticated. Material pieces (e.g., workpieces to be processed) are often transported between different chambers during a fabrication process and processed in different fabrication steps. Thus, to design a method for scheduling pieces of materials that in the real-time with improved computation accuracy is a problem to be solved urgently.

In order to solve at least one of the above technical problems, the present disclosure provides a method and a system for scheduling pieces of materials based on a real-time status of a device, and the method and the system can obtain an effective material path in a real-time manner, thereby improving computation accuracy. The fabrication efficiency of the device can be promoted.

One aspect of the present disclosure provides a method for scheduling pieces of materials based on the real-time status of the device. Scheduling rules for scheduling the pieces of materials may be obtained according to determined parameters. It may be determined whether all designated transmission and process tasks of the pieces of materials are completed. If the designated transmission and processing tasks of the pieces of materials are completed, the scheduling of the pieces of materials may be terminated. If the designated transmission and processing tasks of the pieces of materials are not completed, each of the scheduling rules for scheduling the pieces of materials according to real-time status information of the device may be traversed, and according to a traversing result, operation instructions corresponding to the scheduling rules for scheduling the pieces of materials may be executed. The real-time status information of the device may be updated according to a device status after executions of the operation instructions are completed and it may be redetermined whether the designated transmission and process tasks of the pieces of materials are completed.

Another aspect of the present disclosure provides a system for scheduling pieces of materials based on a real-time status of the device. The system may include a storage unit, a determining unit, a scheduling unit, an executing unit, and an updating unit. The storage unit may be configured to store scheduling rules for scheduling the pieces of materials, and the scheduling rules for scheduling the pieces of materials can be obtained based on determined parameters. The determining unit may be configured to determine whether designated transmission and processing tasks of the pieces of materials are completed; if yes, send a terminating signal to the scheduling unit; and if not, send a traversing signal to the scheduling unit. The scheduling unit may be configured to terminate the scheduling in response to receiving the terminating signal. In response to receiving the traversing signal, the scheduling unit may be configured to traverse each of the scheduling rules for scheduling the pieces of materials that is stored in the storage unit according to the real-time status information of the device and send operation instructions corresponding to the scheduling rules for scheduling the pieces of materials to the executing unit according to a traversing result. The executing unit may be configured to receive the operation instructions from the scheduling unit and send a signal to the updating unit when the executions of the operation instructions are completed. The updating unit may be configured to, according to the signal from the executing unit, update the real-time status information of the device according to a device status after the executions of the operation instructions are completed, and send a redetermining signal to the determining unit.

The method for scheduling the pieces of materials based on the real-time status information of the device according to the present disclosure can obtain the scheduling rules for scheduling the pieces of materials offline in advance based on the determined parameters. While online scheduling is performed, each of the scheduling rules for scheduling the pieces of materials can be traversed based on the real-time status information of the device. Bused on the traversing result, the operation instructions corresponding to the real-time status information of the device can be obtained. Using this method, the scheduling rules for scheduling the pieces of materials can be obtained offline, and while online scheduling, the operation instructions corresponding to the online real-time status information of device can be obtained. This method can not only obtain an appropriate path for transporting pieces of materials in a real-time manner, but also improve computation accuracy. Therefore, the fabrication efficiency of the device can be improved by using this method.

Using the system for scheduling the piece of material based on the real-time status of the device according to the present disclosure, the scheduling rules for scheduling the pieces of materials can be stored in advance by the storage unit. Each of the scheduling rules for scheduling the pieces of materials can be traversed according to the real-time status information of the device by the scheduling unit. According to the traversing result, the operation instruction corresponding to the real-time status information of the device can be obtained by the scheduling unit. The scheduling unit can, control the executing unit to execute the operation instructions corresponding to the real-time status of the device. The system can not only obtain an appropriate path for transporting material in a real-time manner, but also improve computation accuracy. Therefore, the fabrication efficiency of the device can be improved by using this system.

DETAILED DESCRIPTION

To clearly describe objectives, technical solutions, and advantages of the present disclosure, a method and a system for scheduling pieces of materials based on a real-time status of a device according to the present disclosure are described below with reference to the accompanying drawings. It should be understood that specific embodiments described herein are only used to explain the present disclosure and not used to limit the present disclosure.

Figure 1:
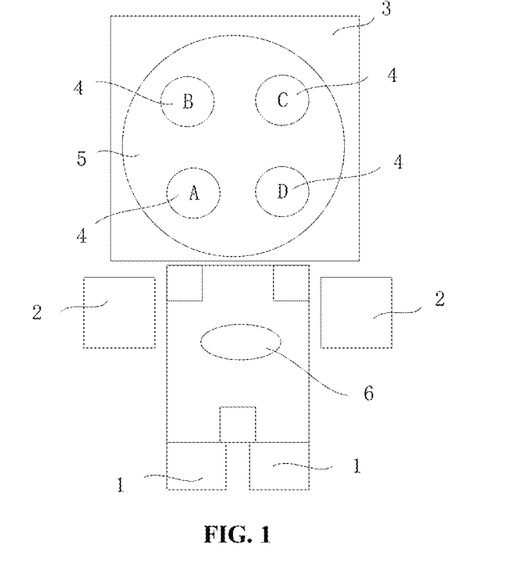
FIG. 1 is a schematic diagram of a typical distributed Bragg reflector device.

In a semiconductor fabrication process, when a piece of material is processed in a distributed Bragg reflector device, as shown in FIG. 1, the piece of material is usually transported among different chambers including a buffer chamber (not shown), a pre-cleaning chamber 1, a high-temperature desorption degassing, chamber 2, and a processing chamber 3. Furthermore, the piece of material may need to be transported among different processing positions A, B, C, and D of the processing chamber 3. Transmission of the piece of material among different chambers can be achieved by a robot 6, while transmission of the piece of material among different processing positions A, B, C and D can be achieved by rotating a turntable 5. Table 1 shows a list of processing steps and corresponding time parameters of the piece of material being processed in the distributed Bragg reflector device by two processing categories. According to Table 1, due to a difference between the time for transporting the piece of material and the time for processing the piece of material, there may exist an idle resource in the distributed Bragg reflector device, and the idle resource may become a bottleneck of fabrication efficiency.

TABLE 1

Material processing steps and time parameters in the distributed Bragg reflector device

| | Processing category | |
|---|---|---|
| Processing step | Two-step processing (s) | Three-step processing (s) |
| Pre-cleaning chamber | 200 s | 200 s |
| High-temperatute desorption degassing chamber | 90 s | 90 s |
| Processing chamber (processing position A) | 135 s | 135 s |
| Processing chamber (processing position B) | 270 s | 135 s |
| Processing chamber (processing position C) | — | 135 s |
| Robot picking-and-placing | 2 s | 2 s |
| Turntable rotating 45° | 2 s | 2 s |

One method is a search tree-based enumeration method. The method exhausts all possible transmission sequences of the piece of material using a search tree method, based on a designated transmission path of the piece of material and parameters of each part of the device (e.g. time for the robot to transport a wafer), and identifies a branch that has the shortest time as a piece of material transmission sequence. However, for a very complex transmission path of the piece of material, the search tree generates so many branches that it may take a long time to exhaust all possible transmission sequences of the piece of material, therefore the calculation efficiency is quite low, and the calculation cannot be in a real-time manner.

Further, an N-step segmented scheduling strategy may be used to solve the above problem. The strategy is with a given search range N, using an algorithm to simulate a scheduling result of a system within N steps, evaluating branches of N steps, and according to an evaluation result, identifying an effective path branch as a sequence for scheduling the transmission of the piece of material. Although the strategy can achieve the algorithm calculation in the real-time manner under a complex condition, a calculation result obtained using the strategy is usually not a theoretical effective path and may result in a long time for fabrication. Especially for a device with a relatively simple structure and material transmission path, the piece of material transmission sequence obtained using the strategy is not effective and cannot satisfy device production capacity requirement. When 25 pieces of materials are processed using the two processing categories listed in Table 1, there is a big deviation between the time spent on the theoretical effective path and the time spent on adopting the N-step segmented scheduling path. As shown in Table 2, the deviation is equal to a difference between the time required by the N-step segmented scheduling path and the time required by the theoretical effective path; and the deviation percentage is equal to a ratio of the deviation to the time required by the theoretical effective path.

TABLE 2

Comparison between the time spent on the theoretical effective path and the time spent on the N-step segmented scheduling path

| | N-step segmented scheduling path | Theoretical effective path | Deviation | Deviation percentage |
|---|---|---|---|---|
| Two-step processing | 127.5 min | 124.2 min | 3.3 min | 2.70% |
| Three-step processing | 99.1 min | 92.7 min | 6.4 min | 6.90% |

Figure 2:
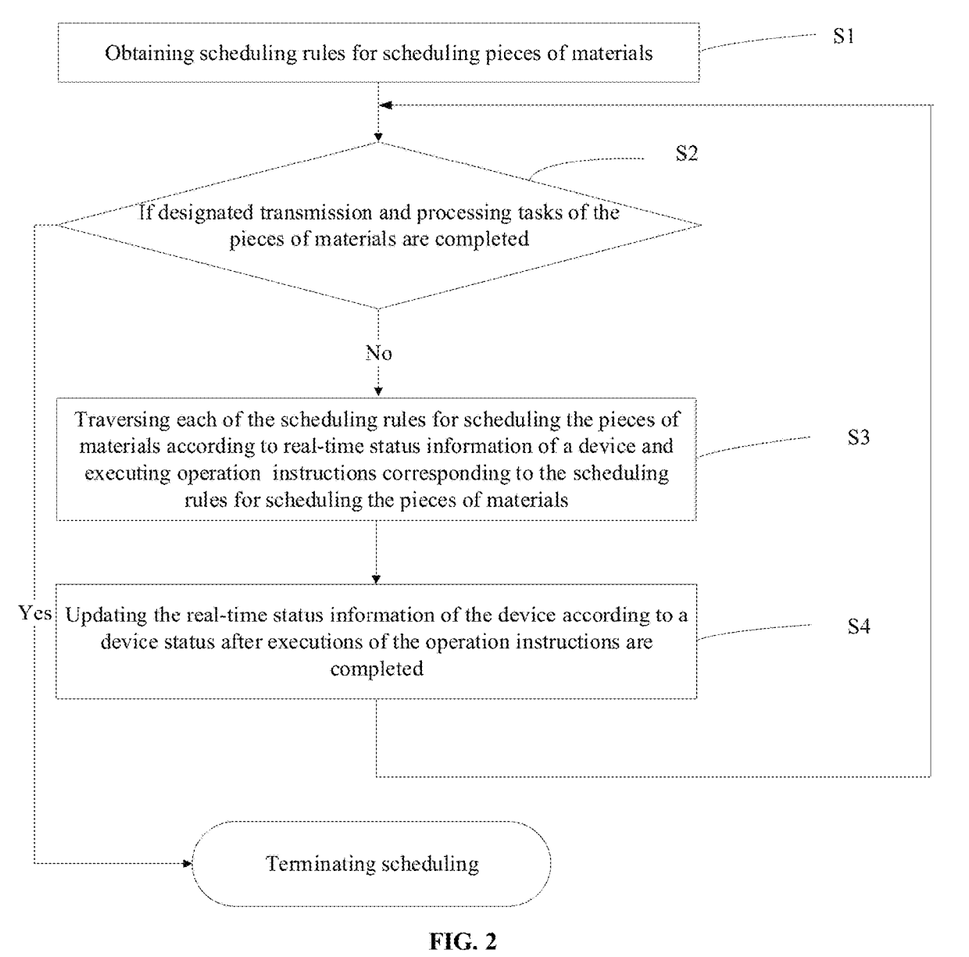
FIG. 2 is a flowchart of a method for scheduling pieces of materials based on a real-time status of a device according to some embodiments of the present disclosure.

Further, FIG. 2 is a flowchart of a method for scheduling pieces of materials based on a real-time status of a device according to some embodiments of the present disclosure. Referring to FIG. 2, the method for scheduling the pieces of materials may include the following procedures.

In S1: According to determined parameters, scheduling rules for scheduling pieces of materials may be obtained and S2 is executed. The scheduling rules obtained according to the determined parameters may be optimal scheduling rules for scheduling the pieces of materials, using which, the pieces of materials can be scheduled and transported in an effective scheduling path.

In S2: It may be determined whether designated transmission and processing tasks of the pieces of materials are completed; if yes, the scheduling is terminated; and if not, S3 is executed.

In S3: Each of the scheduling rules for scheduling the pieces of materials may be traversed according to real-time status information of the device. According to a traversing result, operation instructions corresponding to the scheduling rules for scheduling the pieces of materials may be executed and S4 is executed.

In S4: The real-time status information of the device may be updated according to a device status after executions of the operation instructions are completed, and S2 is reprocessed.

S1 may be executed offline, and according to S1, the scheduling rules for scheduling the pieces of materials may refer to effective sequences for transporting the pieces of materials during the entire process. In practical applications, because material transmission time is different from material processing time, and the device often simultaneously processes multiple pieces of the pieces of materials, there may exist an idle resource in the device, and the idle resource may become a bottleneck in improving the fabrication efficiency. Therefore, how to arrange the sequences for transporting the pieces of materials and an initial time for processing the pieces of materials at each processing position of the processing chamber, etc. (i.e. how to design the scheduling rules for scheduling the pieces of materials) is the key factor to improve the production capacity of the device. In addition, the scheduling rules for scheduling the pieces of materials can be designed according to the determined parameters. The determined parameters may include: a pre-cleaning time, a degassing time, a processing time of the piece of material being processed at each processing position, a picking-and-placing time of a robot, a transmission time of the pieces of materials moving from a current processing position to a next processing position, etc., and any combination thereof.

In some embodiments, based on the determined parameters, the scheduling rules for scheduling the pieces of materials are obtained based on a dynamic programming theory or similar mathematical models to increase the production capacity of the device.

According to S3, the real-time status information of the device may refer to the current working status of the chamber, and the robot, etc., and contain a plurality of status parameters, such as whether a piece of material is contained in the chamber, whether the processing of the chamber is completed, and whether the robot is idle, etc.

The scheduling rules for scheduling the pieces of materials may be obtained based on the determined parameters offline. During the online scheduling, each of the scheduling rules for scheduling the pieces of materials may be traversed based on the real-time status information of the device. Operation instructions corresponding to the scheduling rules for scheduling the pieces of materials according to a traversing result may be executed. Using this method, the scheduling rules for scheduling the pieces of materials can be obtained offline, and while online scheduling, operation instructions corresponding to the real-time status information of the device can be executed. This method can not only obtain an effective path of pieces of materials in a real-time manner, but also improve computation accuracy. Therefore, fabrication efficiency of the device can be improved by using this method.

Figure 3:
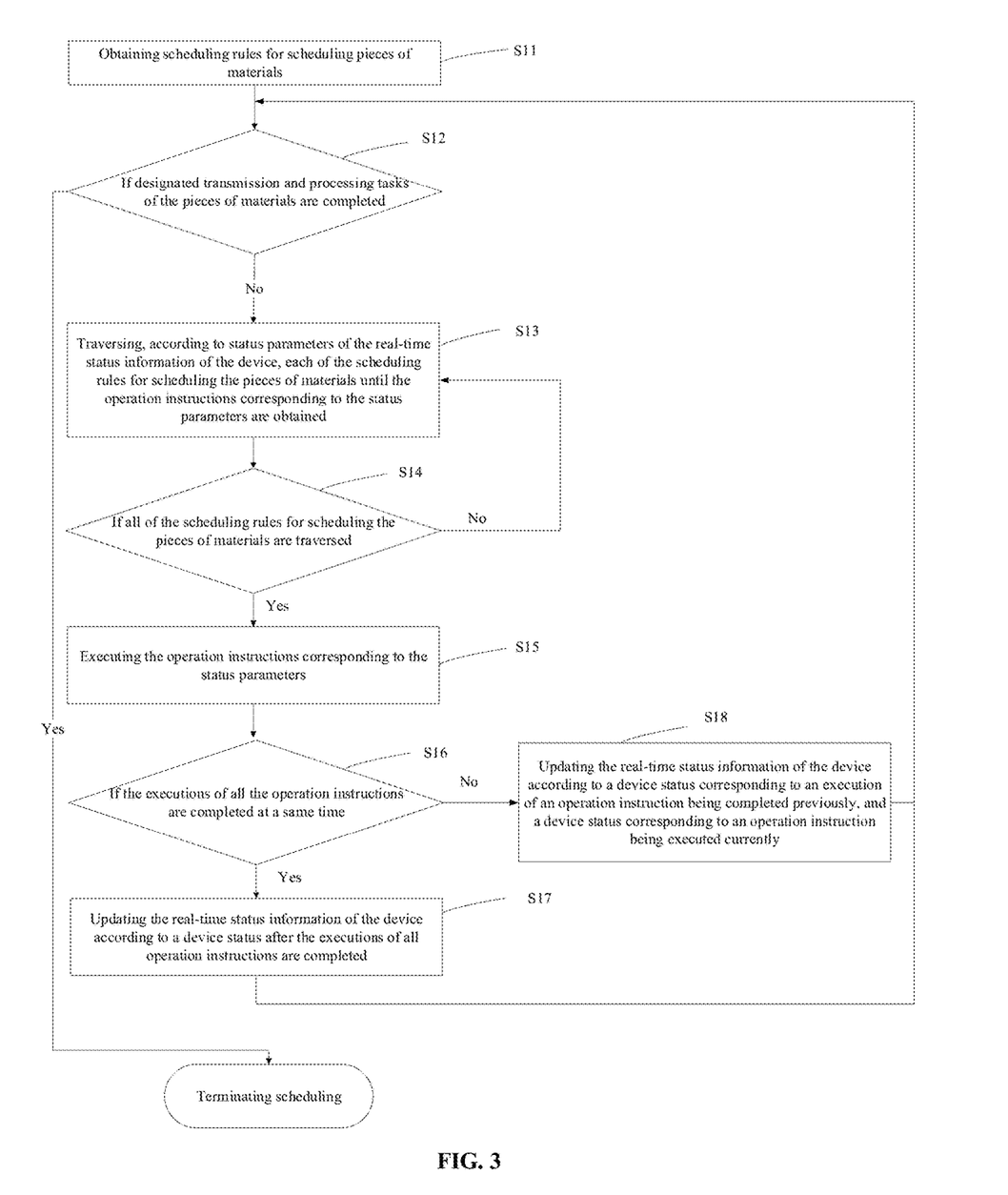
FIG. 3 is a flowchart of another method for scheduling pieces of materials based on a real-time status of a device according to some embodiments of the present disclosure.

FIG. 3 is a flowchart of another method for scheduling pieces of materials based on a real-time status of a device according to some embodiments of the present disclosure. Referring to FIG. 3, the method for scheduling the pieces of materials may include the following procedures.

In S11: According to determined parameters, scheduling rules for scheduling pieces of material may be obtained in advance, and S12 is executed. The scheduling rules obtained according to the determined parameters may be optimal scheduling rules for scheduling the pieces of materials, using which, the pieces of materials can be scheduled and transported in an effective scheduling path.

In S12: It may be determined whether designated transmission and processing tasks of the pieces of materials are completed; if yes, the scheduling is terminated; and if not, S13 is executed.

In S13: According to status parameters of the real-time status information of the device, each of the scheduling rules for scheduling the pieces of materials may be traversed until the operation instructions corresponding to the status parameters are obtained, and S14 is executed.

In S14: It may be determined whether all the scheduling rules for scheduling the pieces of materials are traversed to obtain the operation instructions corresponding to the scheduling rules; if yes, S15 may be executed; or if not, S13 may be reprocessed.

In S15: The operation instructions corresponding to all status parameters of the real-time status information of the device may be executed and S16 is executed.

In S16: It may be determined whether executions of all the operation instructions are is completed at the same time, and if yes, S17 may be executed; or if not, S18 may be executed.

In S17: The real-time status information of the device may be updated according to a device status after the executions of all the operation instructions are completed, and S12 may be reprocessed.

S18: The real-time status information of the device may be updated according a device status corresponding to an execution of an operation instruction being completed previously, and a device status corresponding to an operation instruction being executed currently, and S12 may be reprocessed.

According to S13, the real-time status information of the device may include a plurality of status parameters, and each of the scheduling rules for scheduling the pieces of materials may be traversed with respect to each status parameter until operation instructions corresponding to all the status parameters are obtained. Moreover, after each of the scheduling rules for scheduling the pieces of materials is traversed according to a real-time status parameter and an operation instruction corresponding to the status parameter may be obtained, the operation instruction may be stored rather than executed immediately. After the operation instructions corresponding to all status parameters are obtained, the operation instructions may be executed at the same time.

There are two scenarios of the completion time of the executions of all operation instructions. In the first scenario, it may be that executions of all the operation instructions are completed at the same time. In the second scenario, it may be that an execution of an operation instruction is completed, and an execution of another operation instruction is in process. Therefore, S16 may be included to identify the above two different scenarios and update the status of the device accordingly. If the first scenario is identified, S17 may be executed; and if the second scenario is determined, S18 may be executed.

Taking the distributed Bragg reflector device shown in FIG. 1 as an example, the scheduling rules for scheduling the pieces of materials according to some embodiments of the present disclosure are described below in detail. In some embodiments, the device may include a loading chamber, a pre-cleaning chamber, a degassing chamber, and a processing chamber. A robot may be disposed at the loading chamber and configured to transport pieces of materials among the pre-cleaning chamber, the degassing chamber and the processing chamber. A plurality of processing positions may be symmetrically distributed along the circumferential direction of processing chamber and configured to independently process pieces of materials. A turntable and a disc may be also disposed at the processing chamber, and configured to be rotated to transport the piece of material to a position above the disc. The disc may be configured to be lifted to transport the piece of material to the processing position or the turntable.

Further, each disc may be disposed below each corresponding processing position in a one-to-one correspondence. A plurality of loading positions configured to load the piece of material may be uniformly disposed along the circumferential direction at the turntable, and the robot may transfer each of the pieces of materials to each loading position of the turntable at designated picking-and-placing positions. By rotating the turntable, each loading position can be rotated to a position above each disc in a one-to-one correspondence. By lifting each disc, each of the pieces of materials at each loading position can be lifted in a one-to-one correspondence and transported to the processing position for processing. After processing is completed, by lowering the disc, each of the pieces of materials may be transported to the turntable. By rotating the turntable, each of the pieces of materials may be transported to the designated picking-and-picking positions and picked up by the robot.

Figure 4A:
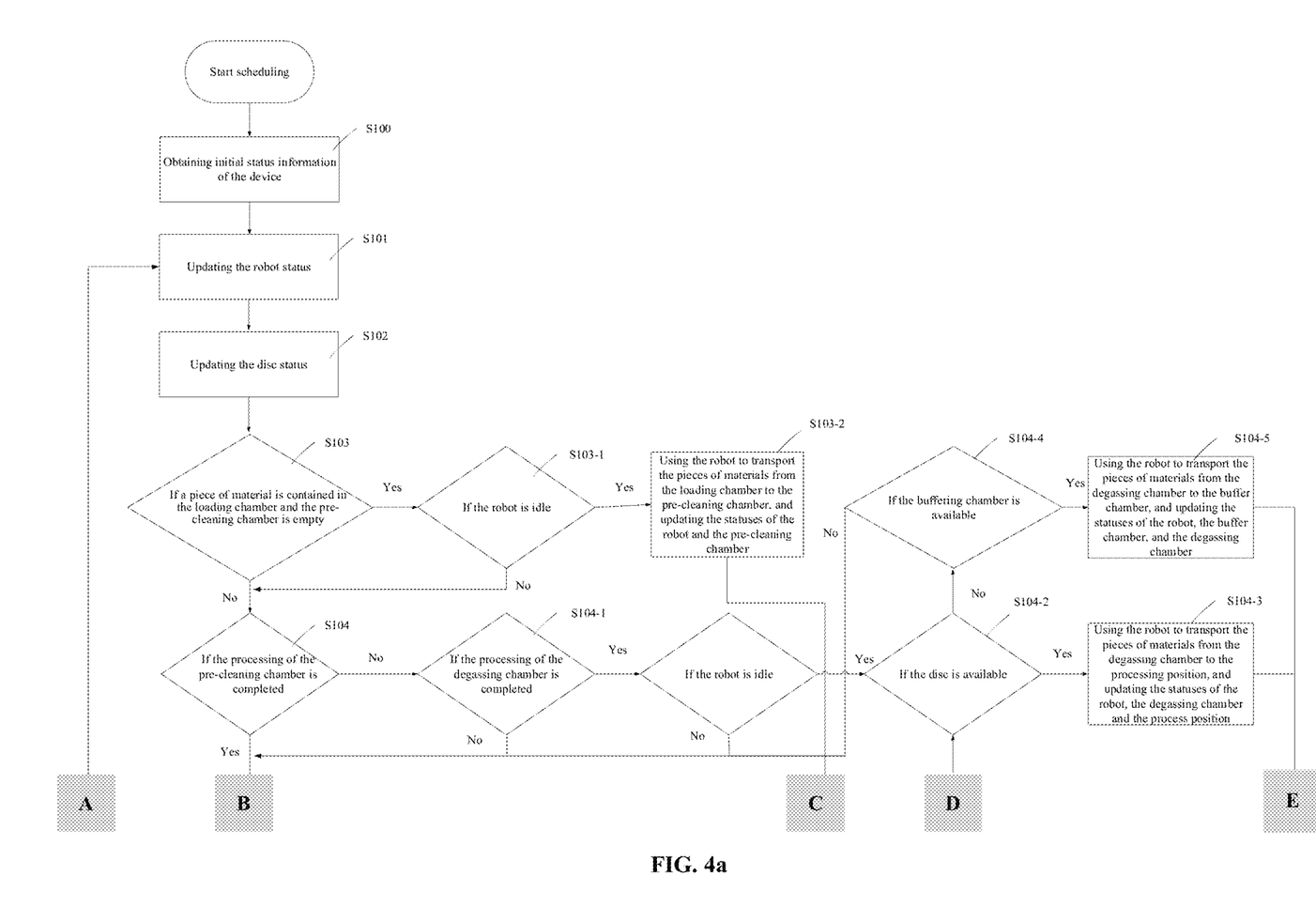
FIGS. 4a and 4b as combined illustrate a schematic diagram of a rule for scheduling the pieces of materials corresponding to the method shown in FIG. 3.
Figure 4B:
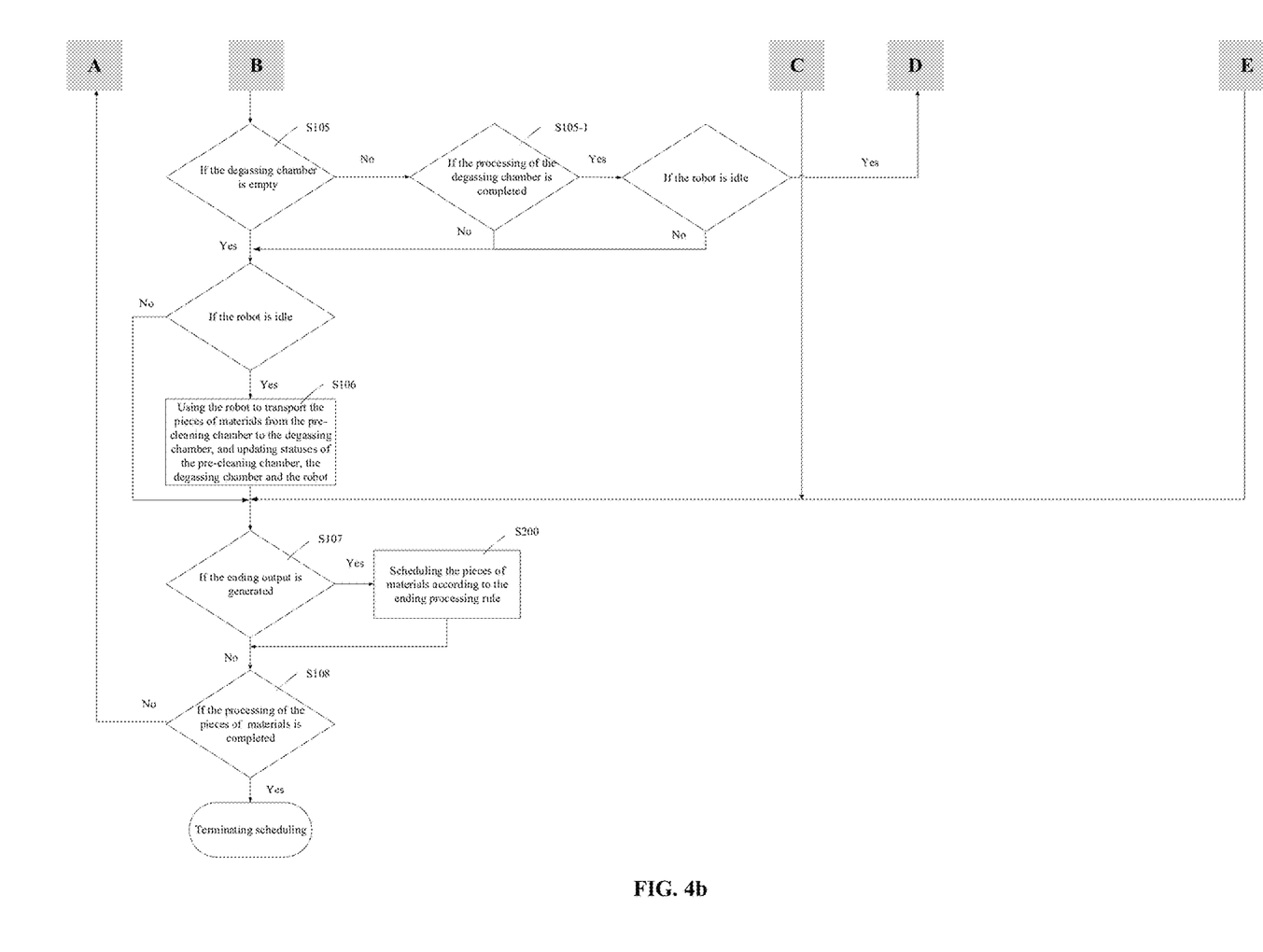

FIGS. 4a and 4b as combined is a schematic diagram of a calculated rule for scheduling the pieces of materials by using a distributed Bragg reflector device as an example according to some embodiments of the present disclosure. Referring to FIGS. 4a and 4b, the rule for scheduling the pieces of materials may include the following procedures.

In S100: Initial status information of the device may be obtained and S101 is executed. The initial status information of the device may include whether a piece of material is contained at each chamber, the processing status of the pieces of materials (unprocessed, being processed, and processed), the status of the robot (idle and in transfer), the status of the turntable (rotated, unrotated), and the status of the disc (idle and occupied), etc.

In S101: A status of the robot may be updated S102 is executed.

In S102: A status of the disc may be updated and S103 is executed.

In S103: It may be determined whether a piece of material is contained in the loading chamber and the pre-cleaning chamber is empty; if yes, S103-1 may be executed; and if not, S104 may be executed.

In S104: It may be determined whether a processing of the pre-cleaning chamber is completed: if yes, S105 may be executed; and if not, S104-1 may be executed.

In S105: It may be determined whether the degassing chamber is empty; if not, S105-1 may be executed; if yes and the robot is idle, S106 may be executed; and if the degassing chamber is empty and the robot is not idle, S107 is executed.

In S106: The pieces of materials may be transported by the robot from the pre-cleaning chamber to the degassing chamber, and statuses of the pre-cleaning chamber, the degassing chamber, and the robot may be updated, S107 is executed.

In S107: It may be determined whether an ending output is generated; if yes, S200 may be executed; and if net, S108 may be executed.

In S200: The pieces of materials may be scheduled according to an ending processing rule, and S108 is executed. The ending output may include a scenario in which no material is contained in the loading chamber, processing of the pre-cleaning chamber and the degassing chamber is completed, and an unprocessed material is contained on the disc.

In S108: It may be determined whether all processing of the pieces of materials is completed; if yes, the scheduling of the pieces of materials can be terminated; and if not, S101 may be reprocessed.

In S103-1: It may be determined whether the robot is idle; if yes, S103-2 may be executed; and if not, S104 may be executed.

In S103-2: The pieces of materials may be transported by the robot from the loading chamber to the pre cleaning chamber, the statuses of the robot and the pre-cleaning chamber can be updated, and S107 may be executed.

In S104-1: It may be determined whether processing of the degassing chamber is completed; if yes and the robot is idle, S104-2 may be executed; if yes but the robot is not idle, S105 may be executed; and if not, S105 may be executed.

In S104-2: It may be determined whether the disc is available, and if yes, S104-3 may be executed.

In S104-3: The pieces of materials may be transported by the robot from the degassing chamber to the processing position, the statuses of the robot, the degassing chamber and the processing positions may be updated, and S107 may be executed.

In S105-1: It may be determined whether the processing of the degassing chamber is completed; if yes and the robot is idle, S104-2 may be executed; and if not, S106 may be executed.

According to S101, based on a transmission initial time, a transmission object and current time of the robot, it may be determined whether the transmission process of the robot is completed, and the status of the robot may be updated based on the determination result. The transmission initial time and the transmission object can be recorded in the status parameters of the robot.

According to S102, based on an initial time of processing the pieces of materials and time required for processing the pieces of materials, whether the processing of the pieces of materials is completed may be determined, and the status of the disc may be updated according to a determined result. In addition, based on an initial time of rotating the turntable, time required for rotating and a current time, whether the rotation of the turntable is completed may be determined, and the status of the turntable may be updated based on the determined result. Further, when the disc is idle, i.e. the turntable is not rotated and the disc is not at the processing position, if an unprocessed material is at the first processing position, the unprocessed material may be started to be processed. When the disc is idle and an unprocessed material on the picking-and-placing position of the turntable, the turntable may be rotated to rotate the unprocessed material below the first processing position, and the unprocessed material may be lifted by the disc to the first processing position.

Whether an unprocessed material is on the second processing position at the turntable may be determined after the rotation of the turntable is completed. If yes, the unprocessed material may be lifted by the disc to the second processing position, and the processing of first processing position and the second processing position may be started at the same time, and a longer processing time between processing time of the first processing position and the second processing position is used as the processing time. If not, only the processing of the first processing position may be started. If the disc, is in the idle state and a processed material is on the loading position of the turntable, the piece of material may be picked up by the robot, and the status of the robot and the status of the disc may be updated.

According to S107, the ending processing rule may include: determining whether the disc is idle; if yes, rotating the turntable to transport the unprocessed pieces of materials to a position above the disc and lifting the disc to transport the unprocessed material to a corresponding processing position for processing. Further, if the disc is idle and an unprocessed material or a processed material is on the loading position of the turntable located below the second processing position, the turntable may be rotated. If unprocessed pieces of materials at both the first processing position and the second processing position, the unprocessed pieces of materials at both processing positions may be simultaneously processed and a longer processing time between two processing time of the two processing positions is determined as the processing time. If an unprocessed material at the second processing position, the processing of material may be started, and the processing time of the second processing position may be identified as the processing time. In terms of other scenarios, as long as a piece of material is on the turntable, the turntable may be rotated. If no material is on the turntable, which may indicate the processing is completed, the program may be terminated. It should be noted that the processing method of two processing positions is merely an exemplary embodiment of the present disclosure; however, the present disclosure is not limited thereto. In practical applications, a processing method of three or more processing positions may be similar to the processing method of two processing positions.

In some embodiments, the device may further include a buffer chamber, and the rules for scheduling the pieces of materials may further include:

In S104-2: It may be determined whether the disc is available; if yes, S104-3 may be executed; and if not, S104-4 may be executed.

In S104-4: It may be determined whether the buffering chamber is available; if yes, S104-5 may be executed; and if not, S105 may be executed.

In S104-5: The pieces of materials may be transported by the robot from the degassing chamber to the buffer chamber, and the status of the robot, the buffer chamber, and the degassing chamber may be updated, and S107 may be executed.

The scheduling rules for scheduling the pieces of materials may be obtained through offline calculation by taking the distributed Bragg reflector device as an example. The scheduling rules for scheduling the pieces of materials are imported into a control system of the device. The device may traverse each of the scheduling rules for scheduling the pieces of materials based on the real-time status information of the device and execute the operation instructions corresponding to the scheduling rules fir scheduling the pieces of materials based on the traversing result, until it is determined that the designated transmission and processing tasks of the pieces of materials are completed. Using this method, the scheduling rules for scheduling the pieces of materials can be obtained offline, and while online scheduling, the operation instructions corresponding to the scheduling rules for scheduling the pieces of materials can be obtained. This method can not only obtain an appropriate path of pieces of materials in a real-time manner, but also improve computation accuracy. Therefore, fabrication efficiency of the device can be improved by using this method.

Figure 5:
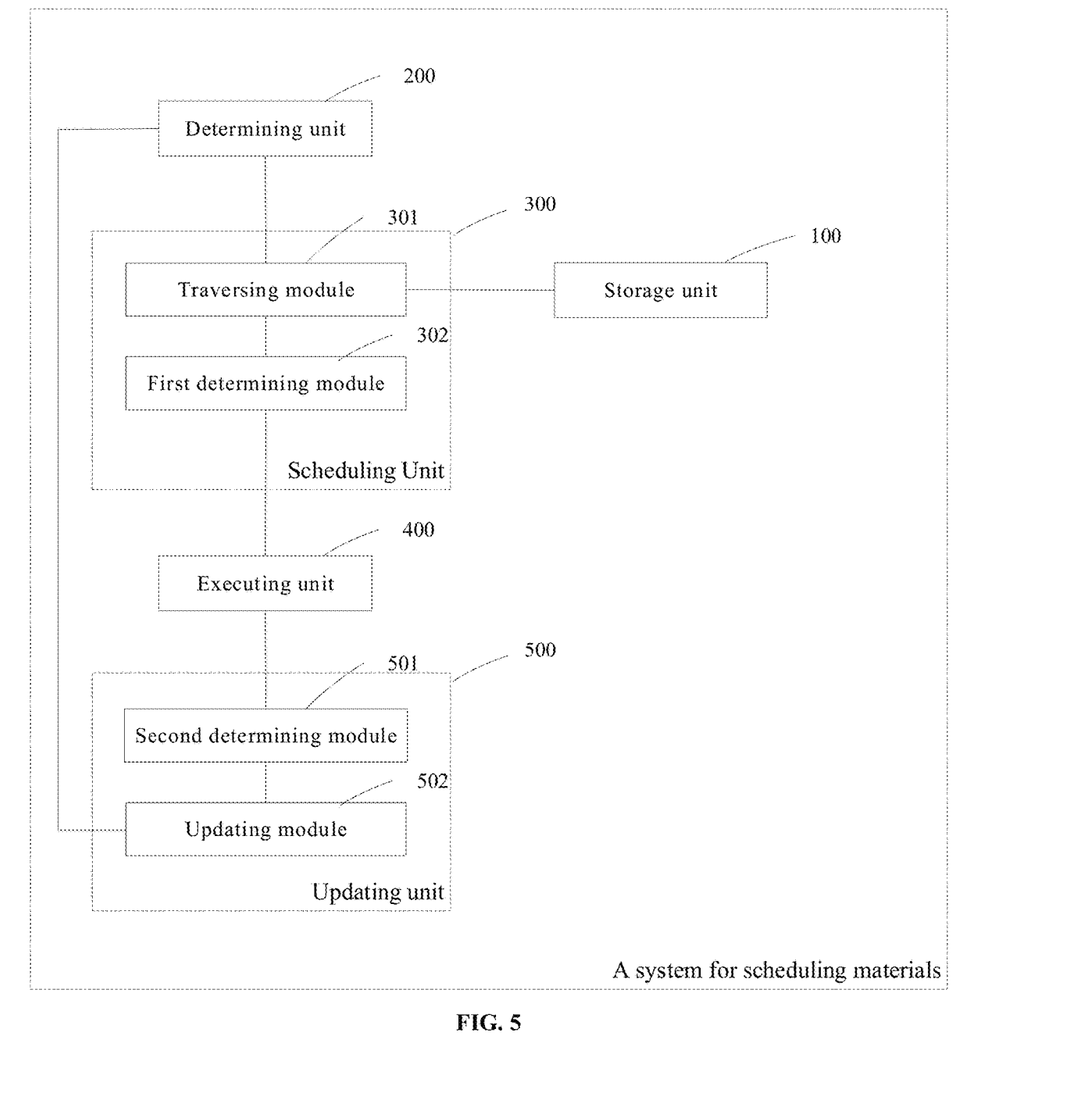
FIG. 5 is a schematic block diagram of a system for scheduling pieces of materials based on a real-time status of a device according to some embodiments of the present disclosure.

Corresponding to the method for scheduling the pieces of materials based on the real-time status of the device of the present disclosure, another aspect of the present disclosure also provides a system for scheduling the pieces of materials based on the real-time status of the device. FIG. 5 is a schematic block diagram of a system for scheduling pieces of materials based on a real-time status of a device according to some embodiments of the present disclosure. Referring to FIG. 5, the system for scheduling the pieces of materials may include a storage unit 100, a determining unit 200, a scheduling unit 300, an executing unit 400, and an updating unit 500. The storage unit 100 may be configured to store scheduling rules for scheduling the pieces of materials. The scheduling rules for scheduling the pieces of materials may be obtained offline based on the determined parameters and stored in the storage unit 100. The scheduling rules for scheduling the pieces of materials and the determined parameters are described in detail in the method for scheduling the pieces of materials, therefore are not elaborated herein.

The determining unit 200 may be configured to determine whether the designated transmission and processing tasks of the pieces of materials are completed; if yes, send a terminating signal to the scheduling unit 300; and if not, send a traversing signal to the scheduling unit. The scheduling unit 300 may be configured to terminate the scheduling in response to receiving the terminating signal. In response to receiving the traversing signal, the scheduling unit 300 may be configured to traverse each of the scheduling rules for scheduling the pieces of materials stored in the storage unit 100 according to the real-time status information of the device. According to the traversing result, the scheduling unit 300 may be configured to send operation instructions corresponding to the scheduling rules for scheduling the pieces of materials to the executing unit 400. The executing unit 400 may be configured to receive the operation instructions from the scheduling unit 300 and send a signal to the updating unit 500 when the execution of the operation instructions is completed. The updating unit 500 may be configured to according to the signal from the executing unit 400, update the real-time status information of the device according to a device status after the execution of the operation instructions is completed, and send a redetermining signal to the determining unit 200.

The scheduling rules for scheduling the pieces of materials may be stored offline by the storage unit 100, and each of the scheduling rules for scheduling the pieces of materials according to the real-time status information of the device may be traversed online by the scheduling unit 300. The operation instructions corresponding to the scheduling rules for scheduling the pieces of materials are executed by the executing unit 400 according to the traversing result. Therefore, the effective path of the piece of material can be obtained in a real-time manner, and the computation accuracy can be improved. Therefore, the fabrication efficiency of the device can be improved using this system.

In some embodiments, the scheduling unit may include a traversing module 301 and a first determining module 302. The traversing module 301 may be configured to, in response to receiving the traversing signal from the determining unit 200, traverse each of the scheduling rules for scheduling the pieces of materials, according to status parameters of the real-time status information of the device, until operation instructions corresponding to the status parameters are obtained. The first determining module 302 may be configured to determine whether all of the scheduling rules for scheduling the pieces of materials are traversed by the traversing module 301. If yes, the first determining module 302 may be configured to control the traversing module 301 to send the operation instructions corresponding to status parameters to the executing module 400. If not, the first determining module 302 may be configured to control the traversing module 301 to continue traversing each of the scheduling rules for scheduling the pieces of materials.

The real-time status information of the device may include multiple status parameters. The traversing module 301 may traverse each of the scheduling rules for scheduling the pieces of materials for each status parameter to obtain the operation instructions corresponding to all the status parameters. Moreover, after all of the scheduling rules for scheduling the pieces of materials are traversed according to a status parameter, and an operation instruction corresponding to the status parameter may be obtained. The operation instruction corresponding to the status parameter may be stored in the storage unit 100, rather than sent to the executing unit 400 by the traversing 301 immediately. The first determining module 302 may be configured to determine whether the operation instructions corresponding to all of the status parameters are obtained. After the operation instruction corresponding to all of the status parameters are obtained, the first determining module 302 may send all operation instructions to the executing unit 400 at the same time.

In addition, there are two cases about completion time of the execution of all the operation instructions. A first case is that executions of all the operation instructions are completed at the same time; and a second case is that there is an operation instruction that are executed first. Therefore, the updating unit 500 further may include a updating module 502 and a second determining module 501. The second determining module 501 may be configured to determine whether the executions of all the operation instructions are completed at the same time according to the signal from the executing unit 400; and if yes, send a first signal to the updating module 502; and if not, send a second signal to the updating module 502. The updating module may be configured to, in response to receiving the first signal from the second determining module, update the real-time, status information of the device according to a device status after the execution of the operation instructions is completed and send a redetermining signal to the determining unit. In response to receiving the second signal from the second determining module, the updating module may be configured to update the real-time status information of the device according to a device status corresponding to an execution of an operation instruction being completed previously and to a device status corresponding to an operation instruction being executed currently and send the redetermining signal to the determining unit. Thus, the two different cases can be determined by the second determining module, and according to the two different cases, the status of the device can be updated by the updating module 502.

The foregoing embodiments merely represent some embodiments of the present disclosure, and the specific and detailed description thereof should not be interpreted to limit the scope of the present disclosure. It should be noted that, without departing from the concept of the present disclosure, those skilled in the art can make several variations, all of which should fall within the scope of the present disclosure

What is claimed is:

1. A method for scheduling pieces of materials based on a real-time status of a device, comprising:
   obtaining, according to determined parameters, scheduling rules for scheduling the pieces of materials;
   determining whether designated transmission and processing tasks of the pieces of materials are completed;
   if the designated transmission and processing tasks of the pieces of materials are completed, terminating the scheduling of the pieces of materials; and
   if the designated transmission and processing tasks of the pieces of materials are not completed,
      traversing each of the scheduling rules for scheduling the pieces of materials according to real-time status information of the device, and executing operation instructions corresponding to the scheduling rules for scheduling the pieces of materials according to a traversing result; and
      updating the real-time status information of the device according to a device status after executions of the operation instructions are completed, and redetermining whether the designated transmission and process tasks of the pieces of materials are completed.

2. The method according to claim 1, wherein the determined parameters comprise: a pre-cleaning time, a degassing time, a processing time of the pieces of materials being processed at each processing position, a picking-and-placing time of a robot, and a transmission time of the pieces of materials moving from a current processing position to a next processing position.

3. The method according to claim 1, wherein traversing each of the scheduling rules for scheduling the pieces of materials according to the real-time status information of the device, and executing the operation instructions corresponding to the scheduling rules for scheduling the pieces of materials according to the traversing result, comprises:
   traversing, according to status parameters of the real-time status information of the device, each of the scheduling rules for scheduling the pieces of materials until the operation instructions corresponding to the status parameters are obtained; and
   determining whether all of the scheduling rules for scheduling the pieces of materials are traversed;
   if all of the scheduling rules for scheduling the pieces of materials are traversed, executing the operation instructions corresponding to the status parameters; and if not all of the scheduling rules for scheduling the pieces of materials are traversed, traversing, according to the status parameters, remaining scheduling rules for scheduling the pieces of materials.

4. The method according to claim 1, wherein updating the real-time status information of the device according to the device status that the executions of the operation instructions are completed, and redetermining whether the designated transmission and process tasks of the pieces of materials are completed, comprises:
   determining whether the executions of all the operation instructions are completed at a same time;
   if the executions of all the operation instructions are completed at the same time, updating the real-time status information of the device according to a device status after the executions of all operation instructions are completed, and redetermining whether the designated transmission and process tasks of the pieces of materials are completed; and
   if the executions of the operation instructions are not completed at the same time, updating the real-time status information of the device according to a device status corresponding to an execution of an operation instruction being completed previously, and a device status corresponding to an operation instruction being executed currently, and redetermining whether the designated transmission and process tasks of the pieces of materials are completed.

5. The method according to claim 1, wherein the device comprises a loading chamber, a pre-cleaning chamber, a degassing chamber, and a processing chamber; a robot disposed at the loading chamber for transporting the pieces of materials among the pre-cleaning chamber, the degassing chamber and the processing chamber; a plurality of processing positions symmetrically distributed along a circumferential direction of the processing chamber for independently processing the pieces of materials; a turntable disposed at the processing chamber for transporting the pieces of materials to a position above a corresponding disc by rotating, and a disc disposed at the processing chamber for transporting the pieces of materials to a processing position or on the turntable by lifting, wherein:

the scheduling rules for scheduling the pieces of materials comprise:
S100: obtaining an initial status information of the device;
S101: updating a status of the robot;
S102: updating a status of the disc;
S103: determining whether a piece of material is contained in the loading chamber and the pre-cleaning chamber is empty; if the piece of material is contained in the loading chamber and the pre-cleaning chamber is empty, executing S103-1; and if no material is contained in the loading chamber or the pre-cleaning chamber is not empty, executing S104;
S104: determining whether a processing of the pre-cleaning chamber is completed; if the processing of the pre-cleaning chamber is completed, executing S105; and if the processing of the pre-cleaning chamber is not completed, executing S104-1;
S105, determining, whether the degassing chamber is empty; if the degassing chamber is not empty, executing S105-1; if the degassing chamber is empty and the robot is idle, executing S106; and if the degassing chamber is empty and the robot is not idle, executing S107;
S106: using the robot to transport the pieces of materials from the pre-cleaning chamber to the degassing chamber, and updating statuses of the pre-cleaning chamber, the degassing chamber and the robot;
S107: determining whether an ending output is generated; if the ending output is generated, scheduling the pieces of materials according to an ending processing rule; and if no ending output is generated, executing S108, wherein the ending output includes a scenario in which no material is contained in the loading chamber, processing of the pre-cleaning chamber and the degassing chamber is completed, and an unprocessed material is contained on the disc;
S108: determining whether processing of the pieces of materials is completed; if the processing of the pieces of materials is completed, terminating; and if the processing of the pieces of materials is not completed, executing S101;
S103-1: determining whether the robot is idle; if the robot is idle, executing S103-2; and if the robot is not idle, executing S104;
S103-2: using the robot to transport the pieces of materials from the loading chamber to the pre-cleaning chamber, updating the statuses of the robot and the pre-cleaning chamber, and executing S107;

S104-1: determining whether processing of the degassing chamber is completed; if the processing of the degassing chamber is completed and the robot is idle, executing S104-2; and if the processing of the degassing chamber is not completed, executing S105;
S104-2: determining whether the disc is available, and if the disc is available, executing S104-3;
S104-3: using the robot to transport the pieces of materials from the degassing chamber to the processing position, updating the statuses of the robot, the degassing chamber and the process position, and executing S107; and
S105-1: determining whether the processing of the degassing chamber is completed; if the processing of the degassing chamber is completed and the robot is idle, executing S104-2; and if the processing of the degassing chamber is not completed, executing S106.

6. The method according to claim 5, wherein:
the device further comprises a buffering chamber; and
in S104-2, if the disc is not available, executing S104-4, wherein;
S104-4: determining, whether the buffering chamber is available; if the buffering chamber is available, executing S104-5; and if the buffering chamber is not available, executing S105; and
S104-5: using the robot to transport the pieces of materials from the degassing chamber to the buffer chamber and updating the statuses of the robot, the buffer chamber, and the degassing chamber, and executing S107.

7. The method according to claim 5, wherein the ending processing rule comprises:
determining whether the disc is idle, and if the disc is idle, rotating the turntable to transport the unprocessed pieces of materials to a position above the disc and lifting the disc to transport the unprocessed pieces of materials to a corresponding processing position for processing.

8. The method according to claim 7, comprising: simultaneously processing the unprocessed pieces of materials if the disc is idle and the unprocessed pieces of materials are at two or more processing positions.

9. The method according to claim 1, wherein obtaining, according to the determined parameters, the scheduling rules for scheduling the pieces of materials, comprises: based on the determined parameters, obtaining the scheduling rules for scheduling the pieces of materials based on a dynamic programming theory.

10. The method according to claim 1, wherein obtaining, according to the determined parameters, the scheduling rules for scheduling the pieces of materials includes: obtaining, according to the determined parameters, the scheduling rules based on an offline calculation.

11. The method according to claim 3, further including:
storing each operation instruction corresponding to each of the status parameters after the operation instruction is obtained by traversing each of the optima rules for scheduling the pieces of materials;
obtaining all the operation instructions corresponding to all the status parameters; and
executing all the operation instructions at the same time.

* * * * *